United States Patent [19]
Pfiester et al.

[11] Patent Number: 5,291,053
[45] Date of Patent: Mar. 1, 1994

[54] SEMICONDUCTOR DEVICE HAVING AN OVERLAPPING MEMORY CELL

[75] Inventors: James R. Pfiester; James D. Hayden, both of Austin, Tex.

[73] Assignee: Motorola, Inc., Schaumburg, Ill.

[21] Appl. No.: 909,512

[22] Filed: Jul. 6, 1992

[51] Int. Cl.[5] ............................................. H01L 29/78
[52] U.S. Cl. ..................................... 257/393; 257/903
[58] Field of Search ......................... 257/903, 393, 904

[56] References Cited

U.S. PATENT DOCUMENTS 5,122,857  6/1992  Ikeda et al. ........................... 257/903
5,210,429  5/1993  Adan ...................................... 257/903

OTHER PUBLICATIONS

K. Itabashi, et al.; "A Split Wordline Cell For 16Mb SRAM Using Polysilicon Sidewall Contacts"; IEDM; pp. 477-480 (1991).

H. Ohkubo, et al.; "16Mbit SRAM Cell Technologies for 2.0V Operation"; IEDM; pp. 481-484 (1991).

Primary Examiner—Robert Limanek
Attorney, Agent, or Firm—Jasper W. Dockrey

[57] ABSTRACT

A semiconductor device having an overlapping memory cell (10), which includes a split wordline configuration and intersects at least a portion of the driver gate electrodes with each wordline. In one embodiment, a semiconductor substrate (11) has first and second active regions (13, 15) therein. A driver transistor (20) is formed in the semiconductor substrate (11), wherein the gate electrode (19) of the driver transistor (20) has a first portion overlying the second active region (15), a second portion extending beyond the first active region, and a third portion contacting the first active region (13). A wordline overlies (42) the second active region (15), wherein a first portion of the wordline forms the gate electrode of an access transistor (34) and a second portion of the wordline intersects the second portion of the driver transistor gate electrode (19) forming an overlap region (31).

14 Claims, 4 Drawing Sheets

SEMICONDUCTOR DEVICE HAVING AN OVERLAPPING MEMORY CELL

FIELD OF THE INVENTION

This invention relates in general to a semiconductor device, and more particularly to a memory cell for a semiconductor device.

BACKGROUND OF THE INVENTION

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory device (DRAM) or static-random-access-memory device (SRAM), the components must be arranged compactly if the overall device dimensions are not to become excessively large. This problem is especially critical in SRAM devices where a typical individual memory cell contains as many as six separate components.

One technique to reduce SRAM memory cell dimensions is to split the wordline over the cell. The wordline controls read and write functions to the cell by turning the access transistors on and off. By splitting the word line into two separate lines, a more symmetrical cell layout is possible. However, even with a split wordline memory cell design, a need remains to further reduce the overall cell dimensions. Although split wordline designs reduce the area of the cell, fundamental manufacturing limitations remain. Active surface regions of the cell must be made available for the interconnection of leads providing supply and ground voltages to the cell. In addition, active surface area must be available for the formation of transistors providing read and write functions for the cell. Simple downsizing of components can only be pursued to the limit of the line-width definition capability of the manufacturing process. Once the line-width definition limits are reached, new design methodology must be employed if further reduction in memory cell area is to be achieved.

BRIEF SUMMARY OF THE INVENTION

In practicing the present invention, there is provided a semiconductor device having an overlapping memory cell, which includes a split wordline configuration, wherein the wordlines intersect at least a portion of the driver gate electrodes. The intersection of the driver gate electrodes with the wordlines results in the formation of a memory cell, which requires less substrate surface area than a similar memory cell formed in accordance with the prior art. In one embodiment, a semiconductor substrate has a first and second active region therein. A driver transistor is formed in the semiconductor substrate, wherein the gate electrode of the driver transistor has a first portion overlying the first active region, a second portion extending beyond the first active region, and a third portion contacting the second active region. A wordline overlies the first active region, wherein a first portion of the wordline forms the gate electrode of an access transistor and a second portion of the wordline intersects the second portion of the driver transistor gate electrode forming an overlap region.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES illustrating the various embodiments to indicate corresponding elements.

DETAILED DESCRIPTION OF THE INVENTION

Figure 1:
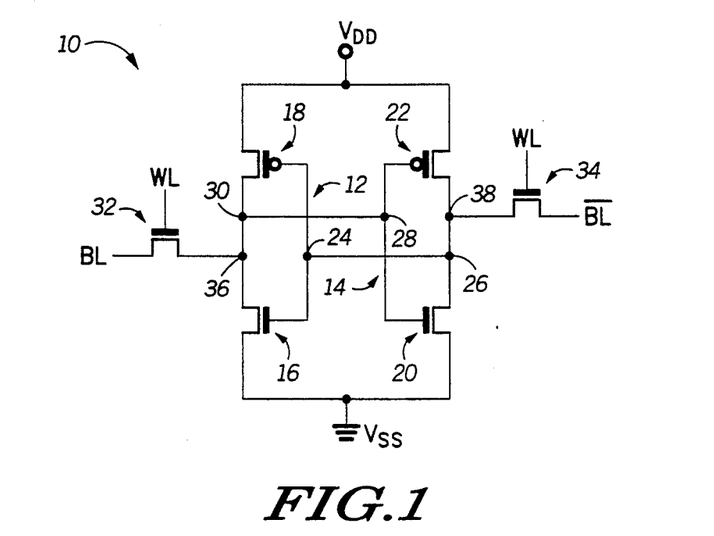
FIG. 1 is a schematic circuit diagram of an SRAM memory cell.

Shown in FIG. 1 is schematic circuit diagram of an SRAM memory cell 10. Memory cell 10 is illustrated in an MOS integrated circuit layout in accordance with the invention in FIG. 2, where like elements have the same reference numbers. Memory cell 10 includes two cross-coupled, CMOS inverters 12 and 14. CMOS inverter 12 includes a driver transistor 16 and a thin-film, pull-up transistor 18. Similarly, CMOS inverter 14 includes a driver transistor 20 and a thin-film, pull-up transistor 22. The input of CMOS inverter 12 is coupled to the output of inverter 14 by nodes 24 and 26 and the input of CMOS inverter 14 is coupled to the output of inverter 12 by nodes 28 and 30. Access transistors 32 and 34 are coupled to the outputs of inverters 12 and 14 at nodes 36 and 38, respectively. Access transistors 32 and 34 provide bit line access to memory cell 10. As further illustrated in FIG. 1, a Vdd signal is provided to the source regions of transistors 18 and 22 and a Vss signal is provided to the source regions of transistors 16 and 20.

Figure 2:
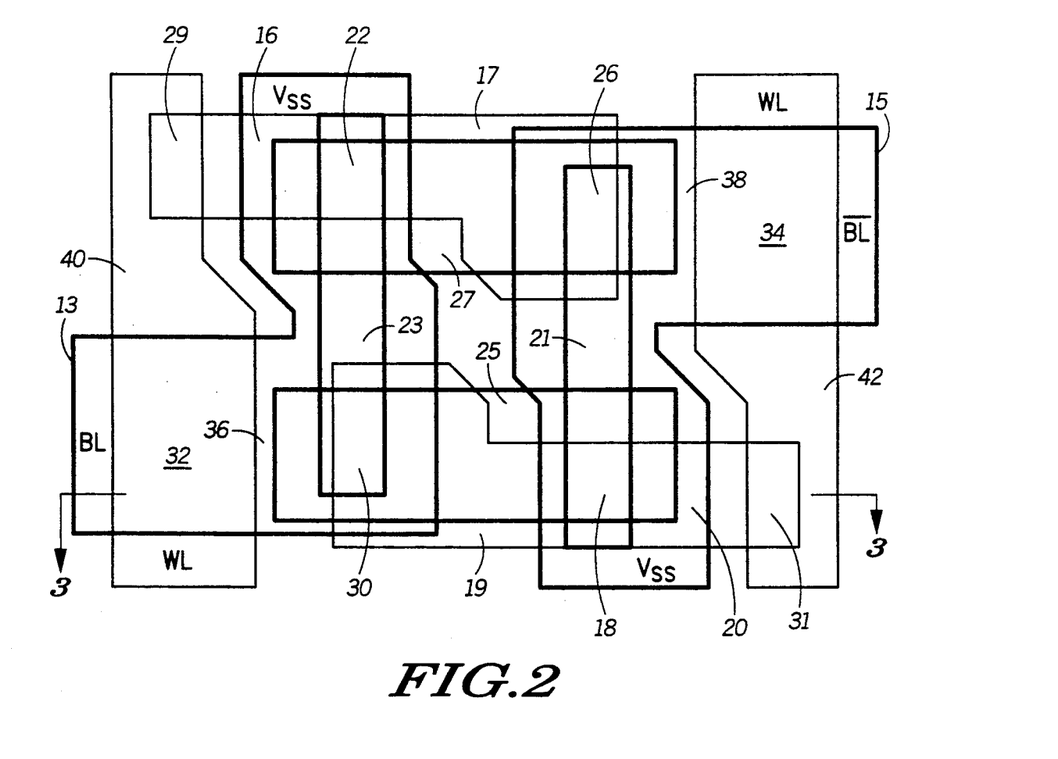
FIG. 2 is a plan view of a memory cell constructed in accordance with a first embodiment of the invention.

A first embodiment of an overlap layout for memory cell 10 is shown in the plan top view of FIG. 2. The locations of the transistors and nodes shown in FIG. 1 are illustrated in FIG. 2. Wordlines 40 and 42 overlie active regions 13 and 15, respectively. A portion of word line 40 passing over active region 13 forms the gate of access transistor 32. Similarly, a portion of word line 42 overlying active region 15 forms the gate of access transistor 34. Driver transistors 16 and 20 are formed in active regions 13 and 15, respectively. A driver gate electrode 17 of driver transistor 16 contacts active region 15 at node 26. Similarly, a driver gate electrode 19 of driver transistor 20 contacts active region 13 at node 30. Thin-film transistors 18 and 22 are formed in layers of conductive material, which overlie and are insulatively spaced away from transistors 16 and 20. A pull-up gate electrode 21 of transistor 18 contacts the drain of transistor 20 at node 26. Similarly, a pull-up gate electrode 23 of transistor 22 contacts the drain of transistor 16 at node 30. Conductive thin-film layers 25 and 27 form the source, drain, and channel regions of transistors 18 and 22, respectively. The drain regions of transistors 18 and 22 are coupled to the drain regions of transistors 16 and 20 at nodes 26 and 30, respectively.

The inventive layout design of memory cell 10, illustrated in FIG. 2, affords a reduction in total cell area through a combination of selective geometric patterning together with overlapping conductive leads. A particular feature of the embodiment shown in FIG. 2 is the overlapping of wordlines 40 and 42 with the gate electrodes of transistors 16 and 20. Overlap regions 29 and 31 enable the total cell area to be reduced by sharing a portion of substrate surface area adjacent to each active region. In overlap region 29, a portion of driver gate electrode 17 intersects wordline 40 adjacent to active region 13. Similarly, in overlap region 31, a portion of driver gate electrode 19 intersects wordline 42 adjacent to active region 15. The intersections formed in overlap regions 29 and 30 are possible because driver gate electrodes 17 and 19 and wordlines 40 and 42 are formed by separate conductive layers defined at different points in the fabrication process.

Bit line signals are introduced to memory cell 10 at active region 13 adjacent to wordline 40 and at active region 15 adjacent to wordline 42. Vss signals are introduced to memory cell 10 via active regions 13 and 15 adjacent to driver gate electrodes 17 and 19.

The inventive design of the overlap layout shown in FIG. 2 enables memory cell 10 to have a high cell ratio. The cell ratio is given by the ratio of the width-to-length (W/L) values of the driver transistor to the access transistor. To obtain optimum performance the cell ratio is commonly specified to be at least 3.0 or larger. In the overlap layout shown in FIG. 2, the channel length, or L value, of driver transistors 16 and 20 is substantially less than the corresponding channel length of access transistors 32 and 34. For example, in one embodiment of the invention, the channel length of access transistors 32 and 34 is about twice that of the driver transistors 16 and 20. The geometric configuration of the access and driver transistor gate electrodes integrates with the configuration of the active regions to provide a memory cell having a small surface area and a large cell ratio.

Figure 3:
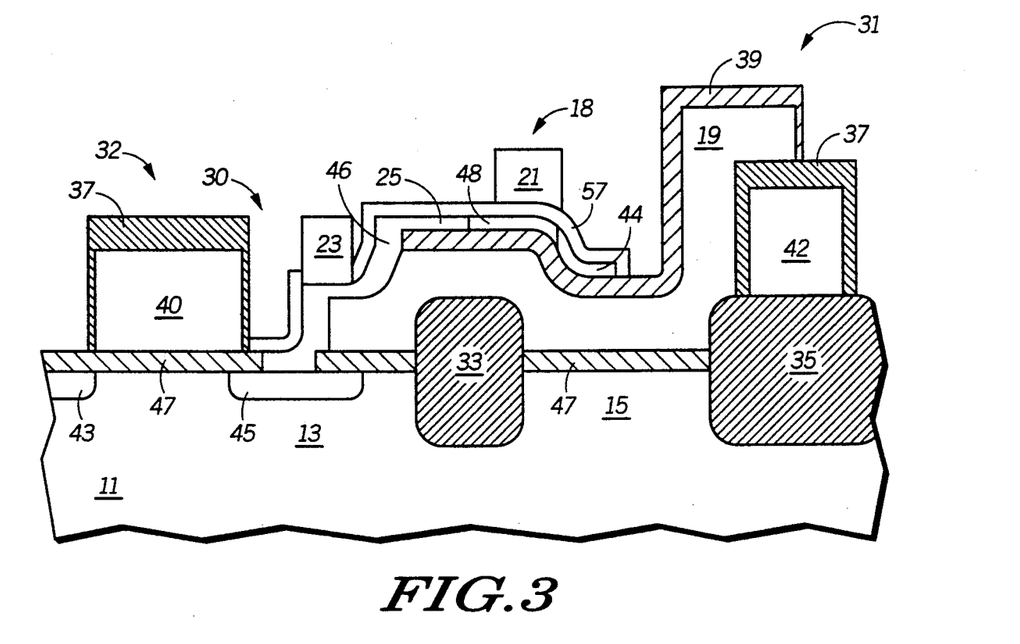
FIG. 3 illustrates a cross section of the first embodiment taken along line 3—3 of FIG. 2.

Shown in FIG. 3 is a cross sectional view of memory cell 10 taken along the section line 3—3 in FIG. 2. Field isolation regions 33 and 35 bound active region 15 and isolation region 33 separates active regions 13 from active region 15. A first insulating layer 37 encapsulates wordline 42 and separates driver gate electrode 19 from wordline 42. Overlap region 31 is formed over isolation region 35. A second insulating layer 39 overlies a portion of driver gate electrode 19. Thin-film layer 25 overlies a portion of insulating layer 39 and makes contact with driver gate electrode 19 and pull-up gate electrode 23 at node 30. Thin-film layer 25 is sectioned into a source region 44, a drain region 46, and a channel region 48. Pull-up gate electrode 21 overlies channel region 48 and is separated from channel region 48 by a gate dielectric layer 57. Access transistor 32 includes source and drain regions 43 and 45 residing in substrate 11 on either side of wordline 40, which forms a gate electrode for the transistor. Drain region 45 forms node 36 coupling access transistor 32 to the drain regions of transistors 16 and 18.

Those skilled in the art will recognize that because of the symmetrical design of memory cell 10, a cross section taken through transistors 22 and 34 would appear as the mirror image of that shown in FIG. 3. It should also be noted that for simplicity of illustration, the interconnect layers to the bit line and wordline contacts and the contact openings are not shown in FIG. 3.

The cross sectional view shown in FIG. 3 illustrates the substantial reduction in cell area obtained with overlap regions 29 and 31. By overlapping driver gate electrodes 17 and 19 onto wordlines 40 and 42, respectively, wordlines 40 and 42 can be close to the edge of active regions 13 and 15. Those skilled in the art will recognize that overlap regions 29 and 31 can also be formed by a portion of the wordline overlying the corresponding gate electrode. Accordingly, all such variations of an overlap structure are within the scope of the invention.

Fabrication of the first embodiment of memory cell 10 is preferably performed by the deposition and patterning of two separate conductive layers. A first conductive layer and an overlying insulating layer are deposited, patterned, and etched to form wordlines 40 and 42 and first insulation layer 37. A second conductive layer is deposited, patterned, and etched to form driver gate electrodes 17 and 19. Next, second insulating layer 39 is formed by first oxidizing the driver gate electrodes, then, patterning and etching the oxide layer to remove a portion of the oxide layer over a portion of driver gate electrode 19, which overlies active region 13. A portion of first gate dielectric layer 47 overlying drain region 45 is also removed for the formation of node 30.

The fabrication of thin-film transistor 22 begins with the deposition of a third conductive layer, which is thin-film layer 25. Thin-film layer 25 is preferably formed by chemical vapor deposition of a SiGe layer. Alternatively, thin-film layer 25 can be polysilicon. Preferably, thin-film layer 25 is deposited to a thickness of about 10 to 100 nanometers and most preferably about 25 nanometers. Thin-film layer 25 forms the conductive channel and source and drain regions for thin-film transistor 22.

After the deposition of thin-film layer 25, a photoresist pattern is formed to define source and drain regions for the thin film transistors and a conductivity determining dopant is ion implanted into thin-film layer 25. The implantation forms a drain region in thin-film layer 25, which is slightly off-set from gate electrode 23. In one method, the conductivity determining dopant is boron ion implanted to dose of about $1.0 \times 10^{14}$ to $5.0 \times 10^{15}$ ions per square centimeter. The use of SiGe to form thin-film layer 25 has the particular advantage that, when doped with boron, the boron atoms can be activated at a much lower annealing temperature than in polysilicon. For example, boron will activate at about 500° C. in SiGe, while the same extent of activation in polysilicon requires an annealing temperature of about 900° C. The off-set formed by the photoresist mask removes the P+ junction away from the edge of gate electrode 21. By spacing the P+ junction away from the edge of the gate electrode the off-current of the transistor is maintained at a low value.

Next, the implantation mask is removed and thin-film layer 25 is photolithographically patterned then etched to form thin-film source and drain regions 44 and 46, as shown FIG. 3. After forming the source and drain regions, an oxidation process is carried out to form a thin-film gate dielectric 57 over thin-film layer 25. The oxidation process also anneals the SiGe is to form a crystalline phase. After the oxidation process is performed, thin-film gate dielectric 57 is patterned and etched to form an opening for node 30. After etching an opening in gate dielectric 57 at node 30, a fourth conductive layer is deposited, patterned, and etched to form thin-film gate electrodes 21 and 23. Gate electrode 23 makes contact to thin film drain 46 through the etched opening in gate dielectric 57 at node 30.

Figure 4:
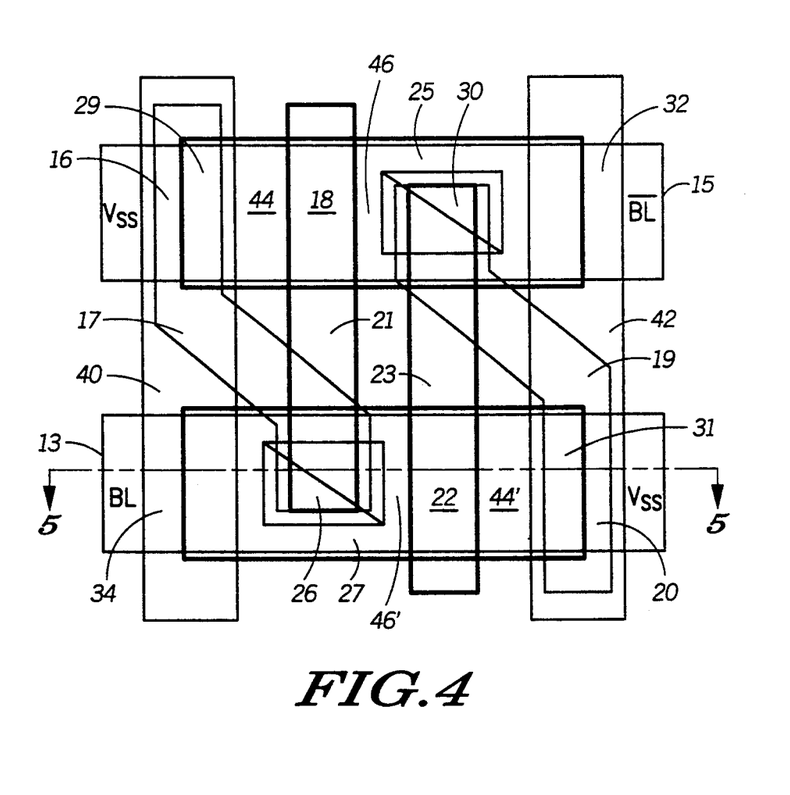
FIG. 4 is a plan view of a memory cell constructed in accordance with a second embodiment of the invention.

A second embodiment of an overlap layout for memory cell 10 is illustrated, in plan view, in FIG. 4. In the overlap layout illustrated in FIG. 4, driver gate electrodes 17 and 19 are coincident with portions of wordlines 40 and 42. Overlap region 29 is formed over a portion of active region 15 directly above driver transistor 16. Overlap region 31 is formed over a portion of active region 13 directly above driver transistor 20. At a point intermediate to active regions 15 and 13, driver gate electrode 17 diverges from wordline 40 and makes contact with active region 13 at node 26. Similarly, driver gate electrode 19 diverges from wordline 42 and makes contact to active region 15 at node 30. Thin-film transistors 18 and 22 are formed over active regions 15 and 13, respectively. Pull-up gate electrode 21 overlies thin-film layer 25 intermediate to transistor 16 and node 30. Thin-film transistor 18 includes source and drain regions 44 and 46 formed in thin-film layer 25 on either side of gate electrode 21, and channel region 48 underlying gate electrode 21. Pull-up gate electrode 21 extends to active region 13 and makes contact with driver gate electrode 17 and active region 13 at node 26. Similarly, pull-up gate electrode 23 overlies thin-film layer 27 intermediate to transistor 20 and node 26. Thin-film transistor 22 includes source and drain regions 44' and 46' formed in thin-film layer 27 on either side of gate electrode 23, and a channel region 48' (not shown) underlying pull-up gate electrode 23. Pull-up gate electrode 23 extends to active region 15 and makes contact with driver gate electrode 19 and active region 15 at node 30. Alternating Vss and bit line signals are introduced to memory cell 10 at opposite ends of active regions 13 and 15.

Figure 5:
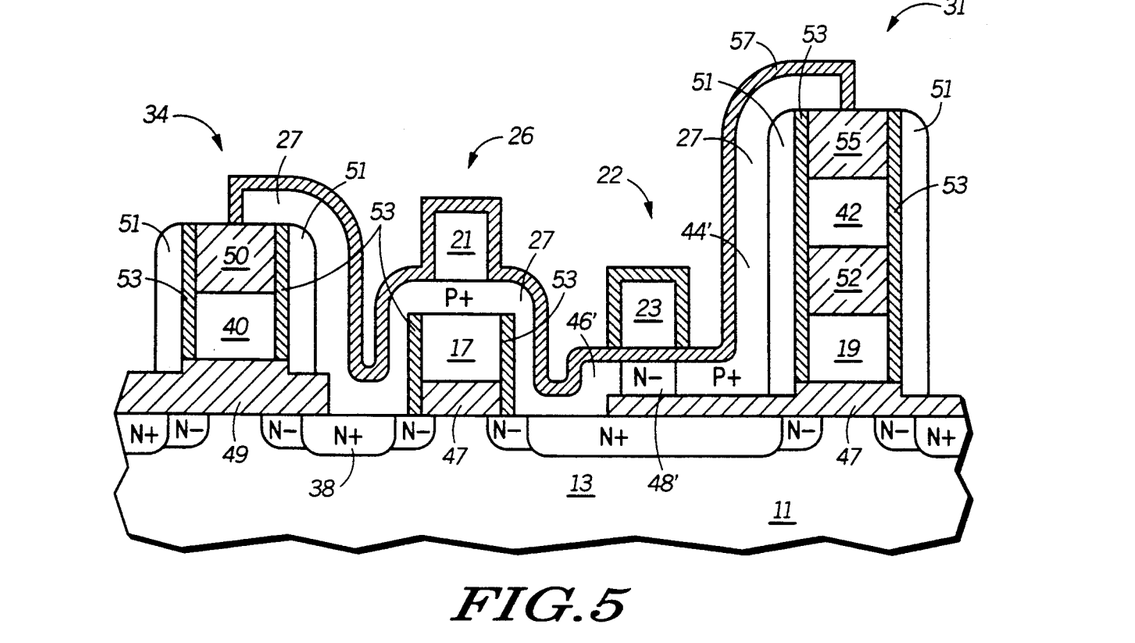
FIG. 5 illustrates a cross section of the second embodiment taken along line 5—5 of FIG. 4.

A cross sectional view of memory cell 10 taken along the line 5-5 in FIG. 4 is illustrated in FIG. 5. The coincidental portion of wordline 42 and driver gate electrode 19 forms overlap region 31, wherein wordline 42 is separated from gate electrode 19 by insulating layer 52. In the overlap embodiment illustrated in FIGS. 4 and 5, overlap regions 29 and 31 are formed over active regions 15 and 13, respectively. By forming coincident overlap regions 29 and 31 over active regions 15 and 13, a considerable reduction in the required surface area for memory cell 10 is achieved.

As illustrated in the sectional view of FIG. 5, driver gate electrode 19 is separated from active region 13 by a first gate dielectric layer 47. At the opposite end of active region 13, wordline 40 is separated from active region 13 by a second dielectric layer 49. Second gate dielectric layer 49 is substantially thicker than first gate dielectric layer 47. Preferably, first and second gate dielectric layers 47 and 49 are silicon dioxide formed by thermal oxidation. In one embodiment, the thickness of second dielectric layer 49 is about twice that of first gate dielectric layer 47. The difference in thickness between first and second gate dielectric layers 47 and 49 is important. The relative gain of the driver transistors and access transistors in the embodiment of memory cell 10 shown in FIGS. 4 and 5 will be determined, in part by the W/L ratio of the transistors, and in part by the thickness ratio of the first and second gate dielectric layers 47 and 49. By varying the thickness of the gate dielectric layers between the driver and access transistors, a large cell ratio is attained without sacrificing active surface area, which would otherwise be needed to properly adjust the W/L ratios of the transistors.

A cross sectional view of thin film transistor 22 is illustrated in FIG. 5. Source region 44' of thin-film transistor 22 overlies a portion of overlap region 31 and drain region 46' makes contact to active region 13 on either side of driver gate electrode 17. Insulation layers 50 and 52 overlie wordline 40 and driver gate electrode 19, respectively. Insulation layer 50 electrically isolates wordline 40 from thin-film layer 27. Insulation layer 52 electrically isolates driver gate electrode 19 from wordline 42 in overlap region 31. Thin film layer 27 is separated from driver gate electrode 19 and wordline 42 by sidewall spacer 51, sidewall insulation layer 53, and by insulation layer 55. Pull-up gate electrode 23 overlies channel region 48' in thin-film layer 27 and source and drain regions 44' and 46' extend away from the channel region on either side of pull-up gate electrode 23. A third gate dielectric layer 57 separates pull-up gate electrode 23 from the underlying channel region. The section through node 26 illustrates the contact arrangement, wherein drain region 46' of thin-film transistor 22 contacts driver gate electrode 17, active region 13, and pull-up gate electrode 21. Access transistor 34 is connected to node 26 through node 38 formed in active region 13. The considerable overlap of thin-film layer 27 over wordline 42, node 26, and access transistor 34 both reduces the total cell area of memory cell 10 and provides a surface region for contact by overlying conductive leads such as Vdd signal lines and the like. The lightly doped drain (LDD) structures of transistors 20 and 34 are illustrated in FIG. 5 and denoted in active region 13 by the symbols N+ and N−. Because of the symmetrical design of memory cell 10, a cross section taken through active region 15 would appear as the mirror image of that shown in FIG. 5.

The fabrication of the second embodiment of memory cell 10 illustrated in FIGS. 4 and 5 preferably begins by oxidizing substrate 11 to form first gate dielectric layer 47. The oxidation process forms a silicon dioxide layer having a thickness of about 4 to 10 nanometers. After forming first dielectric layer 47, a first conductive layer is deposited to overlie the dielectric layer 47. Preferably, the first conductive layer is a polysilicon-refractory metal silicide composition (polycide) and is formed in a three step deposition sequence. In the first step, a thin polysilicon layer is deposited and a photolithographic pattern is formed and boron is ion implanted into active region 13 using the photolithographic pattern as a doping mask. The boron implant (not shown) will adjust the threshold voltage of driver transistors 16 and 20, which are to be constructed in active regions 15 and 13, respectively.

After the boron implantation, the photolithographic pattern is removed and a second layer of polysilicon is deposited. The first and second polysilicon layers are then doped with phosphorus using a thermal doping process. The selective doping process produces a sheet resistance of about 20 to 60 ohms per square. After the thermal doping process is complete, a layer of refractory metal silicide is deposited onto the second polysilicon layer. The formation of the first conductive layer is completed by a subsequent annealing process to form a silicided polysilicon layer. Preferably, the refractory metal silicide is tungsten silicide sputter having a thickness of about 120 nanometers. However, other refractory metal silicides can be used such as silicides of cobalt, titanium, molybdenum, and the like.

Once the first conductive layer is formed, an first insulating layer is deposited onto the first conductive layer. In one deposition method, silicon dioxide is chemical vapor deposited using tetraethyl orthosilicate (TEOS), however, another method such as low temperature silicon oxide deposition (LTO) can also be used. Preferably, the insulating layer is deposited to a thickness of 100 to 300 nanometers. After depositing the insulating layer, driver gate electrodes 17 and 19 are photolithographically defined and a sequential anisotropic etch process is used to form the gate electrodes. First, the insulating layer is etched exposing the first conductive layer. Then the first conductive layer is etched exposing first dielectric layer 47. The sequential etch process forms driver gate electrodes 17 and 19.

After the driver gate electrodes are formed, a second oxidation process forms second dielectric layer 49. The silicon dioxide produced by the second oxidation combines with the existing silicon dioxide in first dielectric layer 47 to form second dielectric layer 49 having a thickness of about twice that of first dielectric layer 47. In the present illustrative embodiment, the thickness of second dielectric layer 49 is about 8.0 to 20.0 nanometers. Then, a second conductive layer and an overlying insulating layer are deposited and etched to form wordlines 40 and 42 and insulation layers 50 and 55. A phosphorus ion implant is performed to the N− doped regions in substrate 11 for the driver and access transistors. The driver gates and wordlines are oxidized to form sidewall insulation layer 53 and a silicon nitride layer is deposited overlying the surface of substrate 11. The silicon nitride layer is anisotropically etched to form sidewall spacer 51. Then, a second ion implant is performed to form N+ regions in substrate 11 adjacent to the N− regions. In addition to forming a lightly doped source and drain structure for the driver and access transistors, the N+ regions also form the substrate portions of nodes 26, 30, 36, and 38. A photomasking and etching step are performed to selectively remove portions of sidewall spacer 51 and second dielectric layer 49. The etch exposes a portion of active regions 13 and 15 for contact by thin-film layer 27, which is deposited after the photomasking layer is removed. Thin-film transistors 18 and 22 are formed in an analogous manner to that previously described for the fabrication of memory cell 10 according to the first embodiment.

Figure 6:
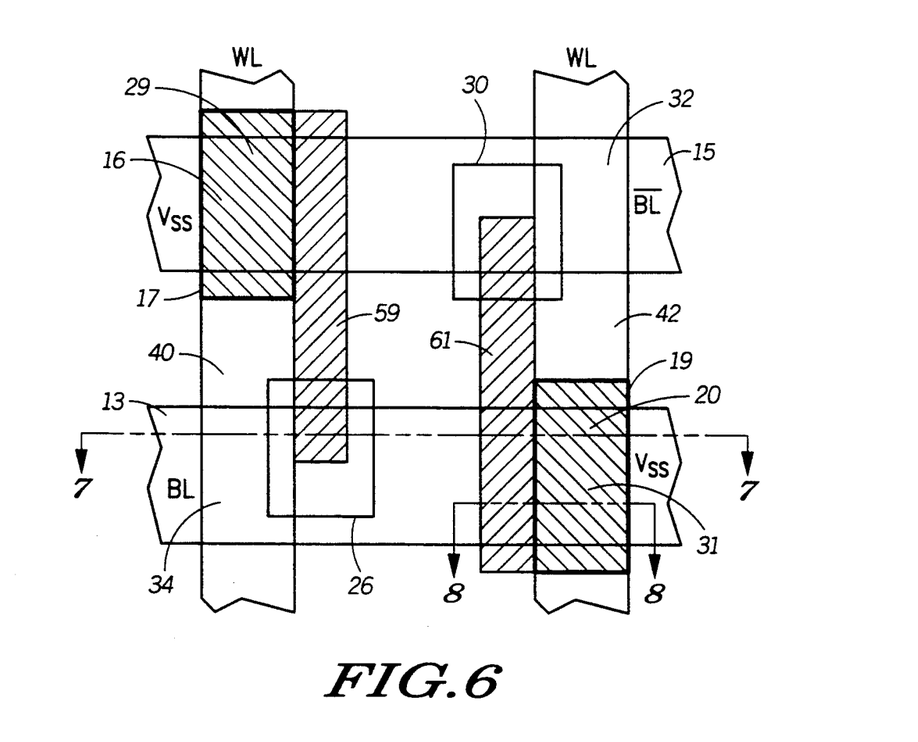
FIG. 6 is a plan view of a memory cell constructed in accordance with a third embodiment of the invention.

A third embodiment of an overlap layout for memory cell 10 is shown in the plan top view of FIG. 6. For clarity of illustration, thin-film transistors 18 and 22 are not shown in FIG. 6. In the embodiment illustrated in FIG. 6, cross coupling of driver transistors 16 and 20 is provided by gate extensions 59 and 61. Gate extension 59 electrically couples driver gate electrode 17 to active region 13 at node 26. Similarly, gate extension 61 electrically couples driver gate electrode 19 to active region 15 at node 30. Wordlines 40 and 42 overlie gate electrodes 17 and 19, respectively, forming overlap regions 29 and 31.

Figure 7:
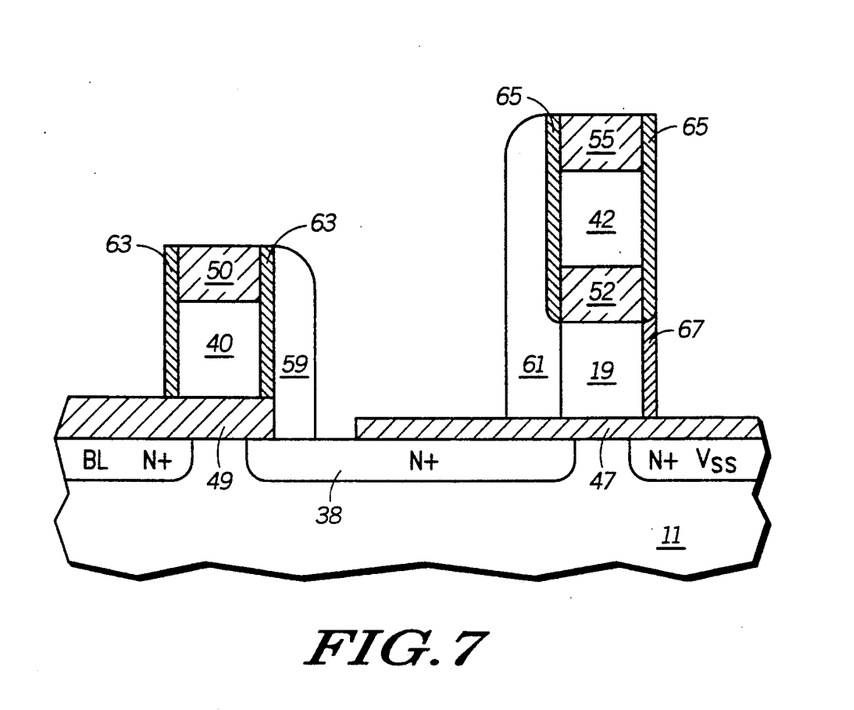
FIG. 7 illustrates one embodiment of a gate extension in a cross sectional view taken along line 7—7 of FIG. 6.

A cross sectional view of memory cell 10 taken along the line 7—7 in FIG. 6 is illustrated in FIG. 7. The sectional view of node 26 illustrates gate extension 59 contacting active region 13 adjacent to wordline 40 at node 38. Gate extension 61 makes contact to a sidewall portion of driver gate electrode 19 and is spaced apart from active region 13 by first gate dielectric layer 47. Wordline 40 is electrically isolated from gate extension 59 by a first sidewall insulating layer 63 overlying the vertical surfaces of wordline 40. A second sidewall insulating layer 65 overlies the vertical surfaces of wordline 42 electrically isolating wordline 42 from gate extension 61. A third sidewall insulating layer 67 overlies a portion of driver gate electrode 19 opposite sidewall extension 61. Thus, driver gate electrode 19 is electrically isolated by the various insulating layers on all surfaces except for a sidewall portion where gate extension 61 makes a metallurgical contact to driver gate electrode 19.

The fabrication of the sidewall contact structure illustrated in FIGS. 6 and 7 begins by forming a first conductive layer on dielectric layer 47. The first conductive layer is preferably formed by chemical vapor deposition of a composite layer comprising a bottom layer of polysilicon, an intermediate layer of SiGe, and a top layer of polysilicon. The SiGe layer functions to provide a Ge rich material for the formation of a water soluble germanium oxide layer, to be described subsequently. Alternatively, the Ge rich layer can be polycrystalline germanium or other Ge-rich alloy, which will form water soluble germanium oxide. The bottom and top layers of polysilicon provide a high quality interface between the conductive layer and adjacent dielectric layers. Next, an insulating layer is deposited to overlie the first conductive layer. Preferably, the insulating layer is silicon oxide deposited by chemical vapor deposition using TEOS source gas. The insulating layer is photolithographically patterned and both the insulating layer and the underlying first conductive layer are etched to form insulating layer 52 and an initial pattern for driver gate electrodes 17 and 19. The initial pattern comprises strips of conductive material overlying active regions 13 and 15 and oriented parallel to the long dimension of active regions 13 and 15.

After depositing and etching the first conductive layer, a second conductive layer, preferably, a polysilicon/refractory metal silicide composite, is deposited and an insulating layer is formed over the second conductive layer. The insulating layer and the underlying second conductive layer are patterned and etched to form insulating layers 50 and 55 and wordlines 40 and 42. After etching away the exposed portion of the second conductive layer, the etch process is continued and exposed portions of the initial pattern of driver gate electrodes 17 and 19 are etched away. The multi-step etching technique using wordlines 40 and 42 as an etch mask aligns the edge of driver gate electrodes 17 and 19 to the edge of wordline 42, as illustrated in FIGS. 6 and 7.

Following the formation of wordlines 40 and 42 and driver gate electrode 19, an oxidation process is carried out to form sidewall insulation layers 63 and 65. After oxidation, the germanium oxide grown on the sidewalls of driver gate electrode 19 is removed by wet etching in a water bath. The water bath does not remove the silicon oxide layers overlying the sidewalls of wordlines 40 and 42. Alternatively, a photolithographic mask can be used to protect one side of driver gate electrode 19 and only the exposed germanium oxide is removed by the water etch. An additional photolithographic patterning and etching step is used to define an opening in first gate dielectric layer 47 adjacent to wordline 40 for node 26.

Once the sidewall of driver gate electrode is exposed, a conductive layer is deposited and etched to form a sidewall layer on wordline 40 and driver gate electrode 19. A photolithographic pattern is formed and a portion of the sidewall layer on one side of both wordline 40 and driver gate electrode 19 is etched away forming gate extensions 59 and 61. The conductive material used to form gate extensions 59 and 61 can be polysilicon, a polysilicon-SiGe alloy, a polysilicon-Ge alloy, or a refractory metal such as tungsten, titanium, molybdenum, and the like.

Figure 8:
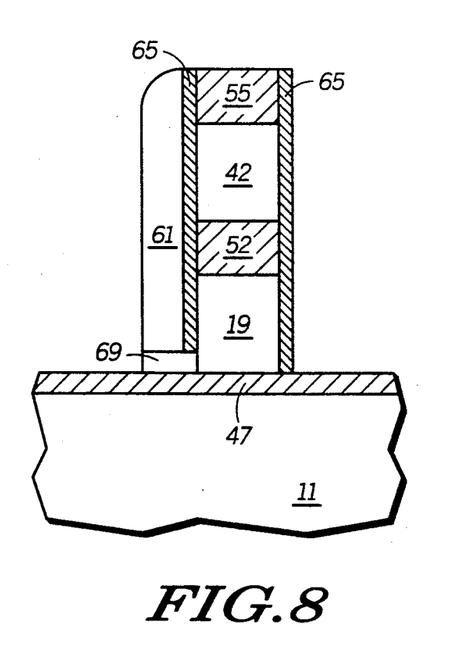
FIG. 8 illustrates another embodiment of a gate extension in a cross sectional view taken along line 8—8 of FIG. 6.

Another embodiment of a sidewall extension structure is shown, in cross section, in FIG. 8. The cross section is taken along the line 8—8 shown in FIG. 6. Gate extension 61 overlies a tab 69, which extends from the bottom of driver gate electrode 19. A metallurgical contact is formed between tab 69 and gate extension 61. Gate extension 61 is electrically isolated from wordline 42 by second sidewall insulating layer 65.

The fabrication of the tab and gate extension illustrated in FIG. 8 begins with a process analogous to that of the second embodiment. First gate dielectric layer 47 is formed by an oxidizing the surface of active region 13. A thin layer of polysilicon is deposited to overlie the dielectric layer 47. A layer of SiGe is deposited to overlie the polysilicon layer, and a layer of silicon nitride is deposited onto the SiGe layer. Next, the nitride layer is photolithographically patterned, and the nitride layer and underlying SiGe and polysilicon layers are sequentially etched. The sequential etch forms an initial driver gate structure overlying active region 13.

After the initial gate structure is formed an oxidation process is performed to form second dielectric layer 49 (not shown). Then, polycide layer is formed over second dielectric layer 49 and the initial gate structure. A TEOS layer is formed over the polycide layer, and the TEOS layer is photolithographically patterned and etched to form wordline 40 and 42. Once the polycide layer is etched, a sequential etch process is used to remove exposed areas of the initial gate structure using wordline 42 as an etch mask. An etch process, which preferentially etches SiGe to polysilicon, is performed to remove all of the exposed SiGe and leaves a thin polysilicon layer 70 unetched to form a resulting structure as illustrated in FIG. 9.

Figure 9:
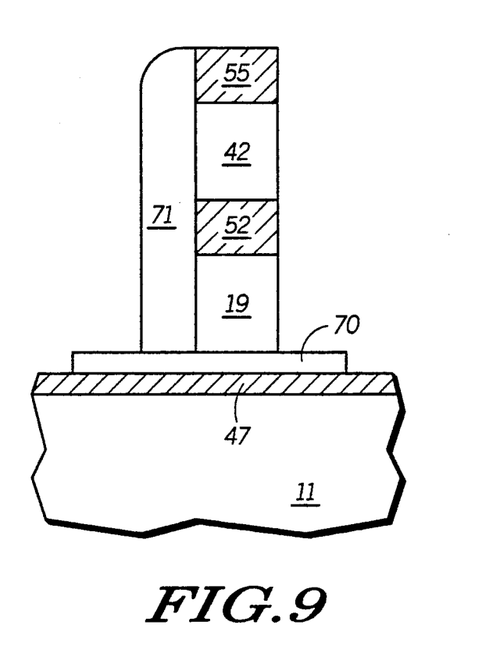
FIG. 9 illustrates yet another embodiment of a gate extension in a cross section view taken along line 8—8 of FIG. 6.

After the SiGe has been defined, a silicon nitride sidewall spacer 71 is formed on one side of the wordline and driver gate stack, as shown in FIG. 9. Sidewall spacer 71 is formed by depositing and anisotropically etching a layer of silicon nitride to form a sidewall spacer on the wordline, driver gate stack. Then, the stack is patterned and etched to remove a portion of the spacer and leave a sidewall spacer 71. Sidewall spacer 71 is used as an etch mask and the remaining exposed portions of the thin polysilicon layer are etched away to form tab 69, shown in FIG. 8. Next, sidewall spacer 71 is removed and a thin TEOS layer is deposited and anisotropically etched to form second sidewall insulating layer 65. Then, a polysilicon layer is deposited and anisotropically etched to form a sidewall layer on the stack. Finally, a photolithographic pattern is formed and a portion of the polysilicon sidewall layer is removed to from gate extension 61.

Thus it is apparent that there has been provided, in accordance with the invention, a semiconductor device having an overlapping memory cell, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the driver transistors can have elevated source and drain regions overlying the surface of the active regions. It is therefore intended to include within the invention all such variations and modifications as fall within the scope of the appended claims and equivalents thereof.

We claim:

1. A semiconductor device having an overlapping memory cell comprising:
    a semiconductor substrate having a first and second active region therein;
    a driver transistor having a unitary gate electrode, the gate electrode having a first portion overlying the first active region, a second portion extending beyond the first active region, and a third portion contacting the second active region;
    a unitary wordline having a first portion overlying the first active region; and
    an access transistor having a gate electrode formed by the first portion of the wordline wherein a second portion of the wordline intersects the second portion of the gate electrode of the driver transistor.

2. The semiconductor device of claim 1, wherein the access transistor is in the first active region and the second portion of the wordline intersects the second portion of the driver transistor gate electrode adjacent to the first active region.

3. The semiconductor device of claim 2, wherein the second portion of the driver transistor gate electrode overlies the second portion of the wordline.

4. The semiconductor device of claim 1, wherein the access transistor is in the second active region and the second portion of the wordline overlies the driver transistor gate electrode.

5. A semiconductor device having an overlapping memory cell comprising:
    a semiconductor substrate having first and second active regions;
    a first driver transistor in the first active region, the driver transistor having a gate electrode overlying a first portion the first active region and making a metallurgical contact to a first portion of the second active region;
    a second driver transistor in the second active region, the second driver transistor having a gate electrode overlying a second portion of the second active region and making a metallurgical contact to a second portion of the first active region;
    a first access transistor in the first active region having a gate electrode formed by a portion of a first wordline overlying a third portion of the first active region, wherein the first wordline intersects a portion of the gate electrode of the first driver transistor; and
    a second access transistor in the second active region having a gate electrode formed by a portion of a second wordline overlying a third portion of the second active region, wherein a second portion of the second wordline intersects a portion of the gate electrode of the second driver transistor.

6. The semiconductor device of claim 5, wherein the intersection of the first and second wordlines with the gate electrodes of the driver transistors comprises a portion of the driver gate electrodes overlying at least a portion of the wordline.

7. The semiconductor device of claim 5, wherein the intersection of the first and second wordlines with the gate electrodes of the driver transistors comprises portion of the wordline overlying at least a portion of the driver gate electrode.

8. The semiconductor device of claim 5 further comprising a first thin-film transistor overlying and electrically isolated from the gate electrode of the first driver transistor and a second thin-film transistor overlying and electrically isolated from the gate electrode of the second driver transistor.

9. The semiconductor device of claim 8, wherein each thin-film transistor comprises:
 a channel and source and drain regions formed in a thin-film layer extending in a direction generally parallel with the underlying gate electrodes of the driver transistors; and
 a gate electrode overlying the thin-film layer and making a metallurgical contact to the drain region of the opposite thin-film transistor.

10. A semiconductor device having an overlapping memory cell comprising:
 a semiconductor substrate having first and second opposed
 a semiconductor substrate having first and second opposed active regions therein;
 alternating driver and access transistors at opposite ends of the first and second active regions,
 each driver transistor having a gate electrode overlying a first portion of each active region, and
 each access transistor having a gate electrode formed by a unitary wordline overlying a second portion of each active region and extending between the first and second active regions, wherein the wordline overlies the corresponding driver transistor gate electrode and is electrically isolated from the driver transistor gate electrode; and
 first and second interconnect means electrically coupling the gate electrodes of the driver transistors to the opposite active region.

11. The semiconductor device of claim 10, wherein each of the first and second interconnect means comprises a lead portion of each driver transistor gate electrode extending between the first and second active regions and contacting the opposite active region adjacent to the access transistor.

12. A semiconductor device having an overlapping memory cell comprising:
 a semiconductor substrate having first and second opposed active regions therein;
 alternating driver and access transistors at opposite ends of the first and second active regions,
 each driver transistor having a gate electrode overlying a first portion of each active region, and
 each access transistor having a gate electrode formed by a wordline overlying a second portion of each active region and extending between the first and second active regions, wherein the wordline overlies the corresponding driver transistor gate electrode and is electrically isolated from the driver transistor gate electrode; and
 first and second interconnect means electrically coupling the gate electrodes of the driver transistors to the opposite active region,
 wherein the each of the first and second interconnect means comprises,
 a projected portion of each driver transistor gate electrode protruding from a lower portion of the gate electrode;
 an insulating layer encapsulating the wordline and overlying the sidewalls of the driver transistor gate electrode;
 a conductive sidewall layer overlying and in electrical contact with the projected portion of the driver transistor gate electrode, wherein the sidewall layer overlies the edge of the driver transistor gate electrode and is separated therefrom by the insulating layer, and wherein the sidewall layer extends along the edge of the wordline to the opposite active region;
 a contact opening in each active region adjacent to the gate electrode of the access transistor; and
 a metallurgic contact formed between the conductive sidewall layer and the active region.

13. The semiconductor device of claim 12, wherein the each of the first and second interconnect means comprises:
 an insulating layer encapsulating the wordline;
 a conductive sidewall layer overlying the edge of the wordline and the driver transistor gate electrode, wherein the sidewall layer is in electrical contact with the edge of the gate electrode, and wherein the sidewall layer extends along the edge of the wordline to the opposite active region;
 a contact opening in each active region adjacent to the gate electrode of the access transistor; and
 a metallurgic contact formed between the conductive sidewall layer and the active region.

14. The semiconductor device of claim 13, wherein the driver gate electrode is comprised of a material selected from the group consisting of germanium and a silicon-germanium alloy.

* * * * *